(12) United States Patent
Degenkolb et al.

(10) Patent No.: US 7,616,448 B2
(45) Date of Patent: Nov. 10, 2009

(54) WRAP-AROUND OVERMOLD FOR ELECTRONIC ASSEMBLY

(75) Inventors: Thomas A. Degenkolb, Noblesville, IN (US); Scott D. Brandenburg, Kokomo, IN (US); Larry M. Mandel, Noblesville, IN (US); Kin Yean Chow, Singapore (SG); Ching Meng Fang, Singapore (SG); Sim Ying Yong, Singapore (SG)

(73) Assignee: Delphi Technologies, Inc., Troy, MI (US)

( * ) Notice: Subject to any disclaimer, the term of this patent is extended or adjusted under 35 U.S.C. 154(b) by 20 days.

(21) Appl. No.: 11/901,042

(22) Filed: Sep. 14, 2007

(65) Prior Publication Data

US 2009/0073663 A1    Mar. 19, 2009

(51) Int. Cl.
    *H05K 5/06* (2006.01)
(52) U.S. Cl. .................. 361/752; 361/728; 361/730; 174/50.5; 174/521; 174/50.51
(58) Field of Classification Search .................. 361/752, 361/728, 730; 174/520, 521, 50.5, 50.51, 174/50.52; 257/678, 687
    See application file for complete search history.

(56) References Cited

U.S. PATENT DOCUMENTS

| 5,376,824 | A | * | 12/1994 | Rauchmaul et al. | ......... | 257/666 |
| 5,477,426 | A | * | 12/1995 | Bethurum | ................. | 361/737 |
| 5,548,485 | A | * | 8/1996 | Bethurum et al. | ........... | 361/737 |
| 5,673,181 | A | * | 9/1997 | Hsu | ........................ | 361/760 |
| 5,861,602 | A | * | 1/1999 | Cox et al. | ............. | 219/121.64 |
| 5,912,806 | A | * | 6/1999 | Onoda et al. | ................ | 361/737 |
| 5,920,119 | A | * | 7/1999 | Tamba et al. | ................ | 257/718 |
| 6,091,605 | A | * | 7/2000 | Ramey et al. | .............. | 361/737 |
| 6,128,194 | A | * | 10/2000 | Francis | ....................... | 361/737 |
| 6,180,045 | B1 | * | 1/2001 | Brandenburg et al. | ....... | 264/263 |
| 6,285,551 | B1 | * | 9/2001 | Brandenburg et al. | ....... | 361/704 |
| 6,307,749 | B1 | * | 10/2001 | Daanen et al. | .............. | 361/704 |
| 6,623,523 | B2 | * | 9/2003 | Weber-Unger et al. | ......... | 623/7 |
| 6,717,051 | B2 | * | 4/2004 | Kobayashi et al. | .......... | 174/535 |
| 6,779,260 | B1 | * | 8/2004 | Brandenburg et al. | ......... | 29/841 |
| 6,927,337 | B2 | * | 8/2005 | Kobayashi et al. | .......... | 174/535 |
| 7,151,674 | B2 | * | 12/2006 | Sasaki et al. | ................ | 361/752 |
| 2007/0121326 | A1 | | 5/2007 | Nall et al. | | |

OTHER PUBLICATIONS

European Search Report dated Nov. 21, 2008.

* cited by examiner

*Primary Examiner*—Dameon E Levi
(74) *Attorney, Agent, or Firm*—Jimmy L. Funke

(57) ABSTRACT

An improved overmolded electronic assembly includes a backplate provided with a recessed edge, a circuit substrate on the backplate, at least one electronic component mounted on the circuit substrate, conductive traces on the circuit substrate which together with the electronic component(s) defines a circuit device, an electrical connector, and an overmold body that has peripheral edges that wrap around sides of the backplate and onto the edge recesses. The resulting over wrap feature eliminates delamination problems that would otherwise occur during thermal cycling of the electronic assembly, improves corrosion resistance at connector-to-backplate interfaces, and enhances securement of the printed circuit board assembly and electrical connector to the assembly.

7 Claims, 1 Drawing Sheet

WRAP-AROUND OVERMOLD FOR ELECTRONIC ASSEMBLY

TECHNICAL FIELD

This invention relates to overmolding of the electronic assemblies and more particularly to an electronic assembly having features that enhance overmolding integrity.

BACKGROUND OF THE INVENTION

In a conventional electronic assembly having a circuit device contained in an overmold package, the overmold material is sometimes bonded to a backplate, with a seal between the electronic device contained in the package housing and the external environment being provided in part by an adhesive bond between the backplate and the overmolding material. This arrangement provides several benefits including durability, mechanical resistance to shock and vibration, and protection of the circuit device from the surrounding environment. However, there is a compound delamination issue at the interface between the backplate and the overmolding material when the package is exposed to thermal cycling. It is believed that this delamination problem is attributable to a substantial difference between the coefficient of thermal expansion of the backplate and the overmold material.

SUMMARY OF THE INVENTION

Irrespective of the exact cause of the delamination problems which occur during thermal cycling at the interface between a backplate and an overmolding material, it has been found that this problem can be obviated by configuring the backplate and the overmold body so that the overmold body wraps around the side and partially around the back side of the backplate.

In accordance with certain aspects of the invention, there is provided an overmolded electronic assembly having a backplate, a circuit substrate attached to a front side of the backplate, a circuit device defined on the circuit substrate, an electrical connector joined to the backplate, and an overmold body having a peripheral edge in adhesive contact with the sides and a backside of the backplate. Because sealing of the overmold material to the backplate occurs along both the sides and part of the backside of the backplate, rather than along only the sides, delamination problems associated with adhesion between the overmolding material and the backplate are avoided.

These and other features, advantages and objects of the present invention will be further understood and appreciated by those skilled in the art by reference to the following specification, claims and appended drawings.

BRIEF DESCRIPTION OF THE DRAWINGS

The present invention will now be described, by way of example, with reference to the accompanying drawings, in which.

DESCRIPTION OF THE PREFERRED EMBODIMENTS

Figure 1:
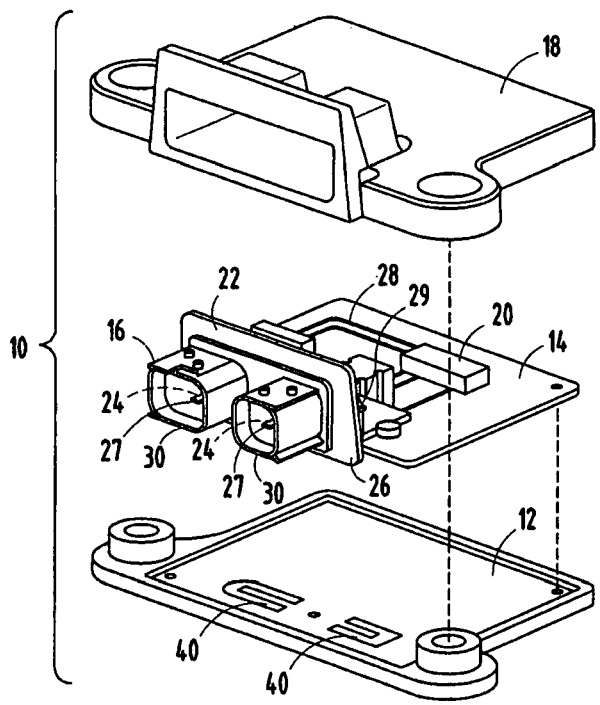
FIG. 1 is an assembly diagram in perspective view showing the components of the electronic assembly of the invention prior to completion of assembly.
Figure 3:
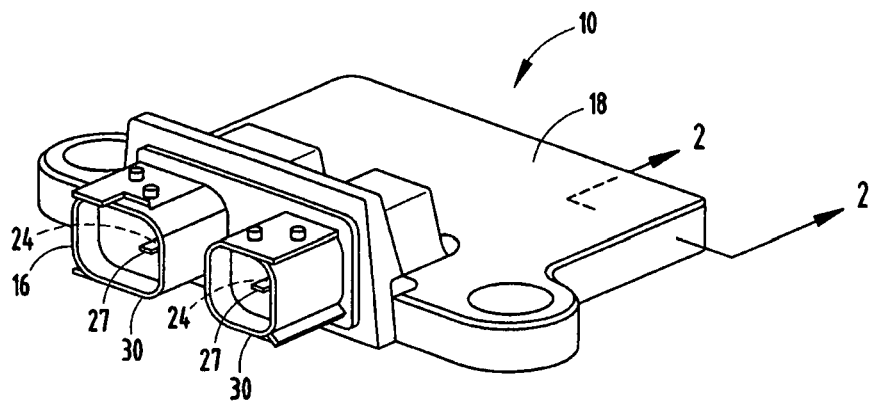
FIG. 3 is a perspective view of a completely assembled electronic assembly in accordance with the invention.

As shown in FIG. 1, an electronic assembly 10 in accordance with invention includes a backplate 12, a circuit substrate 14 on which is defined a circuit device, an electrical connector 16, and an overmold body 18. It is to be understood that overmold body 18 is typically molded directly over circuit substrate 14, and around peripheral edges of backplate 12 and electrical connector 16 to form an integrated structure or assembly 10 as shown in FIG. 3, with the overmold body adhering to peripheral edges of connector 16 and backplate 12 to seal circuit substrate 14 and the circuit device defined on circuit substrate 14 within the integrated structure of assembly 10.

Backplate 12 is a generally planar base member onto which the other components of the electronic assembly are added or assembled and serves as a part of a housing encasing the circuit substrate and circuit device defined on the circuit substrate. In order to avoid delamination issues at the interface between overmold body 18 and backplate 12, backplate 12 is provided with a recessed edge 60 where backside 61 of backplate 12 meets sides 62 (see FIG. 2). Backplate 12 may be composed of metal (e.g., aluminum or aluminum alloy) or of thermoplastic material (e.g., polypropylene, acrylonitrile-butadiene-styrene terpolymer, polycarbonate, etc.).

Circuit substrate 14 may comprise generally any printed circuit board, wiring board or the like on which electronic components may be mounted and on which electrically conductive traces may be defined.

Generally, any electronic component 20 or combination of electronic components may be mounted on circuit substrate 14 to define a circuit device that may be incorporated into an overmolded electronic assembly in accordance with the invention. Such electronic components include, without limitation, integrated circuits, transistors, diodes, resistors, capacitors, and the like. The circuit device may include a plurality of electronic components or a single electronic component such as an integrated circuit chip.

The electrical connectors 16 used in an electronic assembly 10 of the invention generally comprise a thermoplastic body 22 with embedded (e.g., insert molded) electrically conductive elements 24 that extend through a wall member 26 defined by the thermoplastic body, with opposite sections of each of the electrically conductive elements 24 projecting away from opposite sides of wall member 26 to provide connector pins 27 that extend outwardly from the electronic assembly housing and internal electrical connectors 29 that are connected with the circuit device defined on circuit substrate 14.

Electrically conductive traces 28 on circuit substrate 14 together with at least one electronic component 20 define the circuit device on circuit substrate 14. The interface or electrical connection between electrical traces 28 and electrically conductive elements 24 of the electrical connector may be achieved by any known or suitable means, such as by soldering. Alternatively, compliant pin technology may be employed.

Body 22 of electrical connector 16 may be comprised of any suitable thermoplastic material such as acrylonitrile-butadiene-styrene (ABS), polypropylene, polycarbonate, etc., and may be filled or reinforced, such as with glass beads. Thermoplastic body 22 may be fabricated using generally any suitable molding technique, such as injection molding, with electrically conductive elements 24 embedded within wall member 26 of body 22, such as by utilizing an insert molding technique. Integrally defined by thermoplastic body 22 are shrouds 30 that circumscribe the pin sections 27 of electrically conductive elements 24 that project from wall member 26. Shrouds 30 have conventional features for guiding a complementary connector into its proper position and interlocking with the complementary connector to achieve a sufficiently strong and tight connection to ensure a good electrical connection between electrically conductive elements 24 and electrically conductive elements on the complementary connectors.

Figure 2:
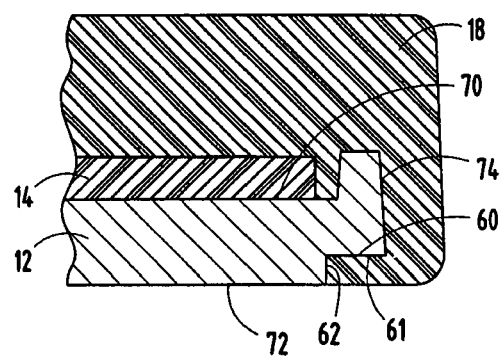
FIG. 2 is a cross-sectional view of the electronic assembly of FIG. 3 as seen along view lines 2-2.

As shown in FIG. 2, backplate 12 includes a top surface 70 on which circuit substrate 14 is mounted, a bottom surface 72 and side surfaces 74 (only one of which is shown). Defined along edges of backplate 12 between bottom surface 72 and sides 74 are edge recesses 60, which may extend along the entire circumferential edge of backplate 12. During molding of overmold body 18, overmolding material is allowed to fill a space defined between surfaces of edge recesses 60 and a mold fixture so that the resulting overmold body formed during molding wraps around sides 74 and onto edge recesses 60 of backplate 12, overcoming delamination problems that would otherwise occur between interfacing surfaces of overmold body 18 and backplate 12.

Except for the recessed edges 61 defined on backplate 12 and overmolding of the assembly to achieve wrap-around adhesion of peripheral edges of overmold body 18 with sides and back surfaces in the recessed edges, other aspects of the process for fabricating overmolded electronic assembly 10 are generally conventional. In general, a circuit device is first fabricated on circuit substrate 14, and then electrical connector 16 is attached to circuit substrate 14 to provide a printed circuit board assembly in which electrical connections with the circuit device defined on circuit substrate 14 are achieved by electrical connection with pins 27 projecting outwardly away from a housing defining the completed assembly 10 (as shown in FIG. 3). The printed circuit board assembly may be affixed to backplate 12 with an adhesive 40 and/or with fasteners such as screws. Thereafter, the combination of the printed circuit board assembly attached to the backplate may be placed in a molding fixture into which an overmold compound is provided to form an overmold body 18 which extends around and along peripheral edges of backplate 12 and into recessed edges 60 to seal the printed circuit board assembly in a housing defined by backplate 12, thermoplastic body 22 of electrical connector 16 and overmold body 18. All or substantially all of the seal joints between overmolded body 18 and backplate 12 are achieved by adhesion at wraparound interfaces between overmold body 18 and edge recesses 60 of backplate 12.

Overmold body 18 may be formed from a thermoset resin, which may be filled or not filled. Examples of thermoset resins which may be employed include epoxy resins, polyester resins, melamine resins, urea-formaldehyde resins, and the like. Fillers that may be employed include talc, silica, glass beads, etc. Overmold body 18 serves to join connector 16 to backplate 12 and complete a sealed housing for the electronic device defined on circuit substrate 14.

It has been found that the improved structure and processes of the invention eliminate delamination problems that occur during thermal cycling, improve corrosion resistance at the connector-to-backplate interface, and enhance securement of the printed circuit board assembly and electrical connector to the assembly 10.

It will be understood by those who practice the invention and those skilled in the art, that various modifications and improvements may be made to the invention without departing from the spirit of the disclosed concept. The scope of protection afforded is to be determined by the claims and by the breadth of interpretation allowed by law.

The invention claimed is:

1. An overmolded electronic assembly comprising:
a generally planar backplate having opposite top and bottom surfaces, side surfaces, and edge recesses between the side and bottom surfaces;
a circuit substrate on the top surface of the backplate;
at least one electronic component mounted on the circuit substrate;
electrically conductive traces defined on the circuit substrate, the electrically conductive traces and the at least one electronic component together defining a circuit device on the circuit substrate;
an electrical connector joined to the circuit substrate, the electrical connector including a thermoplastic wall member having an inner side and an outer side, a plurality of electrically conductive elements extending through the thermoplastic wall member, a section of each electrically conductive element projecting away from the outer side of the thermoplastic wall member to define external connector pins, and a section of each electrically conductive element extending from the inner side of the thermoplastic wall member toward the circuit substrate and electrically connected to the circuit device defined on the circuit substrate; and
an overmold body disposed directly over the circuit substrate and around peripheral edges of the backplate and the electrical connector, the overmold body together with the backplate and thermoplastic wall member of the electrical connector sealingly encasing the circuit substrate and the circuit device defined on the substrate, the overmold body having a peripheral edge that wraps around the sides of the backplate and onto the edge recesses.

2. The assembly of claim 1, wherein the circuit substrate is adhesively bonded to the backplate.

3. The assembly of claim 1, wherein the circuit substrate is mechanically fastened to the backplate.

4. The assembly of claim 1, wherein an integral shroud projects from the thermoplastic wall member and surrounds the external connector pins.

5. The assembly of claim 1, wherein the backplate is comprised of a metal or metal alloy.

6. The assembly of claim 1, wherein the backplate is comprised of an aluminum or an aluminum alloy.

7. The assembly of claim 1, wherein the backplate is comprised of a thermoplastic.

* * * * *